US005874826A

United States Patent [19]

Chen et al.

[11] Patent Number: 5,874,826

[45] Date of Patent: Feb. 23, 1999

[54] ENCAPSULATED MODULAR BOOST CONVERTER AND METHOD OF MANUFACTURE THEREFOR

[75] Inventors: Qing Chen, Plano; Del Ray Hilburn, Mesquite; Ashraf Wagih Lotfi, Rowlett, all of Tex.

[73] Assignee: Lucent Technologies Inc., Murray Hill, N.J.

[21] Appl. No.: 960,633

[22] Filed: Oct. 29, 1997

[51] Int. Cl.$^{6}$ .......... H02M 7/06

[52] U.S. Cl. .......... 323/222; 363/53

[58] Field of Search .......... 363/52, 53, 125, 363/126, 127, 59, 60; 323/222

[56] References Cited

U.S. PATENT DOCUMENTS

| | | | |
|---|---|---|---|
| 4,636,932 | 1/1987 | Kurosawa et al. | 363/54 |
| 4,703,411 | 10/1987 | Umbrichi | 363/57 |
| 4,710,862 | 12/1987 | Asaeda | 363/58 |
| 4,853,835 | 8/1989 | Furuhashi | 363/58 |
| 4,853,836 | 8/1989 | Furuhashi | 363/58 |
| 5,351,179 | 9/1994 | Tsai et al. | 363/53 |
| 5,383,108 | 1/1995 | Okayama | 363/137 |
| 5,450,308 | 9/1995 | Tai | 363/57 |
| 5,461,556 | 10/1995 | Horie et al. | 363/58 |
| 5,483,192 | 1/1996 | Tai | 327/440 |
| 5,535,114 | 7/1996 | Horie et al. | 363/58 |

OTHER PUBLICATIONS

"Power Mosfets—Theory and Applications" by Duncan A. Grant and John Gowar; pp. 358–361 (No Date).

"Electronic Packaging of Power Electronic Building Blocks (PEBB)" by Fred D. Barlow, Douglas Nelson and Aicha Elshabini–Riad; pp. T–9—T–12, (No Date).

Control of Power Electronic Building Blocks (PEBBs) by G.S. Thandi, K. Xing, H. Zhu, F.C. Lee, D. Borojevic; pp. T–13—T–20, (No Date).

"Some Issues Related to Power Electronics Building Blocks" by Kun Xing, Raylee Lin, Fred C. Lee, Dusan Borojevic; pp. T–1—T–7, (No Date).

"PWR –TOP100–4 TOPSwitch® Family Three–terminal Off–line PWM Switch" by Power Integrations, Inc.; Nov. 1994; pp. 1–15.

Toshiba—Data Book—1993—IGBT; pp. 319–323.

*Primary Examiner*—Adolf Berhane

[57] ABSTRACT

A boost converter module, a method of manufacturing the module and a power converter employing one or more of the same. In one embodiment, the boost converter module includes: (1) a power switch, (2) first and second snubber diodes series-coupled between the power switch and a converter output, (3) a snubber capacitor and a boost diode series-coupled across the second snubber diode and (4) an encapsulant substantially surrounding the power switch, the first and second snubber diodes, the snubber capacitor and the boost diode to join the power switch, the first and second snubber diodes, the snubber capacitor and the boost diode into an integrated package, the integrated package having: (4*a*) a control input coupled to the power switch, (4*b*) a power input coupled to the power switch, (4*c*) a snubber inductor input, coupled to a node between the snubber capacitor and the boost diode and (4*d*) a power output coupled to the converter output.

21 Claims, 2 Drawing Sheets

ENCAPSULATED MODULAR BOOST CONVERTER AND METHOD OF MANUFACTURE THEREFOR

TECHNICAL FIELD OF THE INVENTION

The present invention is directed, in general, to power supplies and, more specifically, to an encapsulated modular boost converter and method of manufacture therefor.

BACKGROUND OF THE INVENTION

A power converter is a power processing circuit that converts an input voltage into a specified output voltage. In many applications requiring a DC output, switched-mode DC/DC converters are frequently employed to advantage.

Unlike most of the electronics industry, the power electronics industry rarely utilizes standardized circuit configurations in design work. Whenever a converter is required, a new design is generally created. As the industry exists today, there are multitudinous converter designs in use. Any standardized circuit integration in this area could greatly benefit the establishment.

Lack of integration in converter circuits generates obstacles to standardizing circuits and parts, resulting in long design cycles. Not only is more time required to design an entire circuit, but there is also a greatly increased chance for design errors to arise. Furthermore, designs utilizing power components in discrete forms possess inherent problems not usually associated with integrated circuits.

In addition to design problems, labor-intensive assembling processes and poor manufacturability usually associated with employing discrete parts greatly increase production costs. Since there is no standardization, all assembly is accomplished manually. Human error becomes a concern as expenses increase with mistakes in assembly such as placing components in the wrong position, backwards or even in the place of another element.

Along with manufacturability improvements, increased power density is a continuing goal of modern power supply (e.g., power converter) design. High power density is particularly crucial in applications wherein the allocated space for the power supply relative to the power output is restricted. Large amounts of board area are wasted as the assembler must be able to manually manipulate the components opposed to automated construction which require less construction space and result in less assembly errors.

In addition to being highly compact, the power supply should be efficient to limit heat-creating power dissipation. To dissipate the heat generated in the power supply, typically, heat sinks are mounted on the power supply components. In such components, the power devices are usually attached to the heat sinks manually. Individual heat sinks for the discrete components of the power converter raise some concerns, namely, it creates additional costs that cannot be readily absorbed in a cost competitive market; also, it decreases the flexibility necessary to design a higher circuit density power supply.

During the past several years, there have been many efforts trying to integrate power circuits in the power electronics industry. Many power metal oxide semiconductor field-effect transistors (MOSFETs) and isolated-gate bipolar transistors (IGBTs) used in motor drive industry are integrated in one package formulating so-called power modules. Instead of dealing with multiple discrete active switches, either MOSFETs or IGBTs, designers deal with only one packaged module for a circuit. These type of modules are typically composed of the same type of active switches, and snubber circuitry is excluded.

In power supply industry, the effort has been concentrated on the integration of control, drive and power switch circuitry in one package. Power Integrations, Inc., for instance, has come up with the product family called "TOPSwitch", which integrates a power MOSFET with its associated drive and control circuit packaged in T0220, T0251, or T0252 package. See *TOPSwitch Family Data Sheet*, by Power Integrations, Inc. of Mountain View, Calif., June 1994. Due to limitation of power handling capability and inflexibility of the control configuration, it is limited to the low power applications.

Accordingly, what is needed in the art is an integrated power module in a standardized package that may be implemented in a high power density and high performance power supply.

SUMMARY OF THE INVENTION

To address the above-discussed deficiencies of the prior art, the present invention provides a boost converter module, a method of manufacturing the module and a power converter employing one or more of the same. In one embodiment, the boost converter module includes: (1) a power switch, (2) first and second snubber diodes series-coupled between the power switch and a converter output, (3) a snubber capacitor and a boost diode series-coupled across the second snubber diode and (4) an encapsulant substantially surrounding the power switch, the first and second snubber diodes, the snubber capacitor and the boost diode to join the power switch, the first and second snubber diodes, the snubber capacitor and the boost diode into an integrated package, the integrated package having: (4*a*) a control input coupled to the power switch, (4*b*) a power input coupled to the power switch, (4*c*) a snubber inductor input, coupled to a node between the snubber capacitor and the boost diode and (4*d*) a power output coupled to the converter output.

The present invention therefore provides a modular boost converter "building block" that may be employed in a wide variety of power converter power ranges and capabilities. The unitary nature of the integrated package offers improved mechanical integrity, power density, thermal performance and ease of manufacture.

In one embodiment of the present invention, the boost converter module further includes a single monolithic substrate that supports the power switch, the first and second snubber diodes, the snubber capacitor and the boost diode. Of course, the module may include more than one substrate.

In one embodiment of the present invention, the boost converter module further includes a heat sink in thermal contact with at least one of the power switch, the first and second snubber diodes, the snubber capacitor and the boost diode. The heat sink, which may advantageously be mounted to a monolithic substrate underlying the power switch, the first and second snubber diodes, the snubber capacitor and the boost diode, provides improved thermal performance.

In one embodiment of the present invention, the integrated package further has a ground reference input coupled to the power switch. Of course, the boost converter module is not required to be ground-referenced.

In one embodiment of the present invention, the integrated package further has an input coupled to a node between the first and second snubber diodes. Some power converter topologies require components to be coupled to the node between the first and second snubber diodes. The present invention can accommodate such topologies by providing the input as an option.

In one embodiment of the present invention, the encapsulant is a thermosetting epoxy molding compound. Those skilled in the art are familiar with the types and uses of conventional thermosetting epoxy molding compounds. Of course, the present invention is not limited to such compounds.

In one embodiment of the present invention, the power switch is selected from the group consisting of: (1) a metal oxide semiconductor field-effect transistor (MOSFET), (2) an insulated-gate bipolar transistor (IGBT), (3) a MOS-controlled thyristor and (4) a bipolar junction transistor (BJT). Any combination of the aforementioned, other conventional or later-developed power switches are within the broad scope of the present invention.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
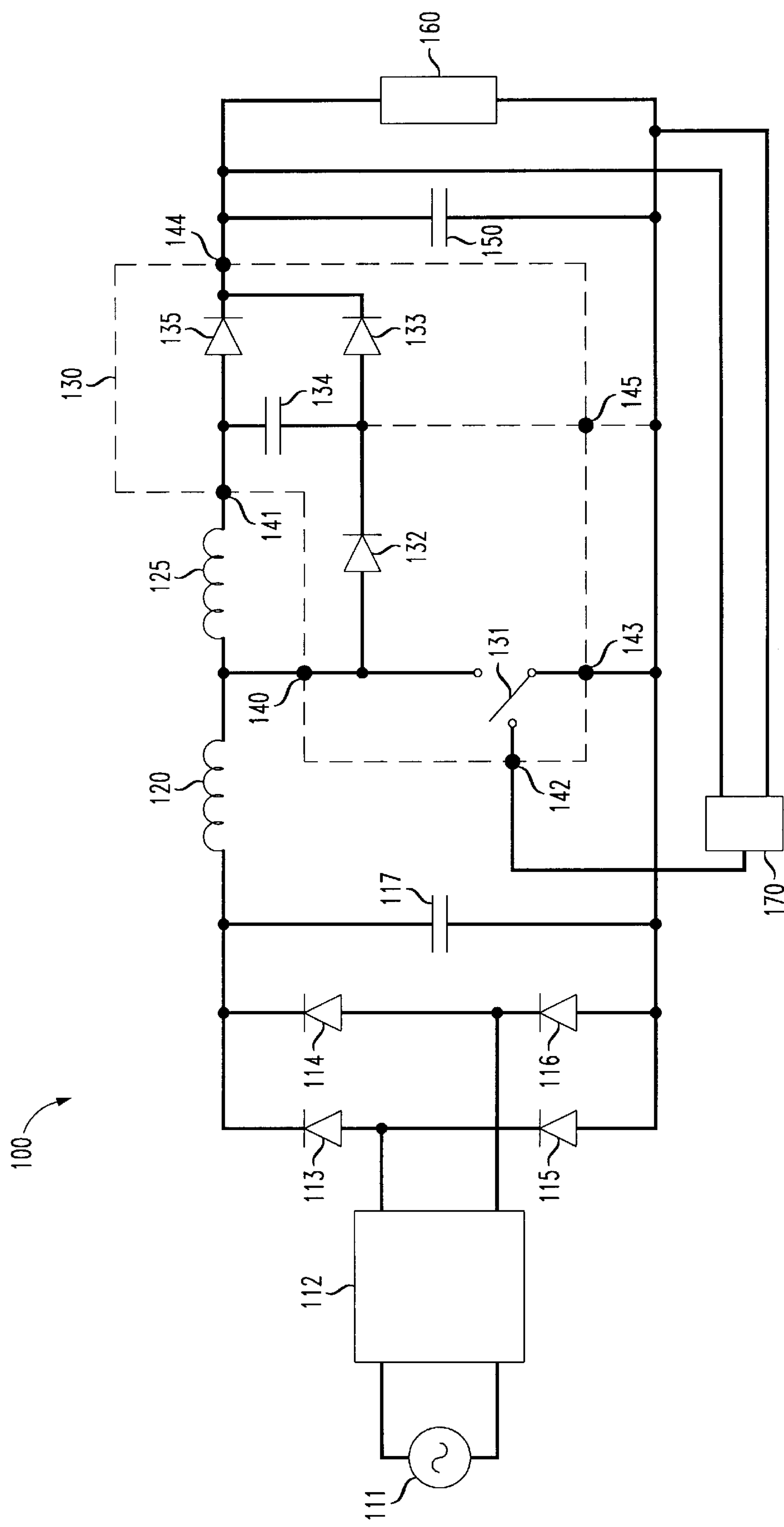
FIG. 1 illustrates a schematic diagram of an embodiment of a power converter constructed according to the principles of the present invention.

Referring initially to FIG. 1, illustrated is a schematic diagram of an embodiment of a power converter 100 constructed according to the principles of the present invention. The converter 100 is coupled to a source of electrical power 111 and includes a filter 112, an input rectifying circuit (e.g., four rectifying diodes 113, 114, 115, 116) and a filter capacitor 117. The converter 100 further includes a boost converter module 130 having a power input 140, a snubber inductor input 141, a control input 142, a ground input 143 and a power output 144. Additionally, an optional input 145 may be utilized. A boost inductor 120 is coupled between the filter capacitor 117 and the power input 140. A snubber inductor 125 is further coupled between the power input 140 and the snubber inductor input 141. An output capacitor 150 and a load 160 are coupled in parallel across the power output 144.

The boost converter module 130 includes a power switch 131 coupled to the power input 140, the control input 142 and the ground reference input 143. The power switch may be, but is not limited to, a metal oxide semiconductor field-effect transistor (MOSFET), an insulated-gate bipolar transistor (IGBT), a MOS-controlled thyristor, a bipolar junction transistor (BJT) or a combination of the above. Other conventional or later-developed power switches are within the broad scope of the present invention. Those skilled in the art also understand that the power switch 131 may be implemented by more than one power switch in parallel. Control circuitry 170 is coupled to the control input 142 so that control signals may applied to the power switch 131. The boost converter module 130 also includes first and second snubber diodes 132, 133 coupled in series between the power switch 131 and the power output 144. The optional input 145, if utilized, would connect to a node between the first and second snubber diodes 132, 133. The boost converter module 130 also includes snubber capacitor 134 and a boost diode 135 coupled in series across the second snubber diode 133. The diodes may be, but are not limited to, pin diodes, Schottky diodes, Gallium Arsenide diodes or a combination of the above. Other conventional or later-developed diodes are within the broad scope of the present invention.

Those skilled in the art understand the operation of the power converter 100 and, as a result, the operation will not be repeated here. However, for a better understanding of power converters, in general, including the boost converter see *Principles of Power Electronics*, by J. Kassakian, M. Schlecht, Addison-Wesley Publishing Company (1991) which is incorporated herein by reference. Those skilled in the art also understand that the boost converter module 130 are often employed in power supplies for power factor correction.

Figure 2A:
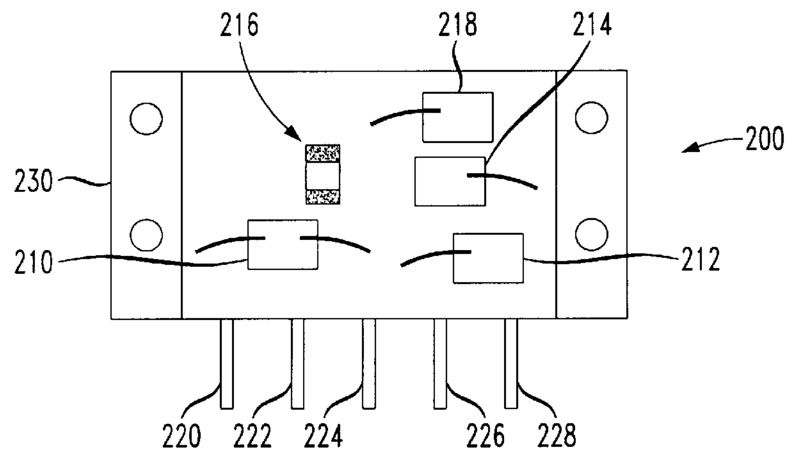
FIGS. 2A, 2B, 2C illustrate views of an embodiment of a boost converter module constructed according to the principles of the present invention.
Figure 2B:
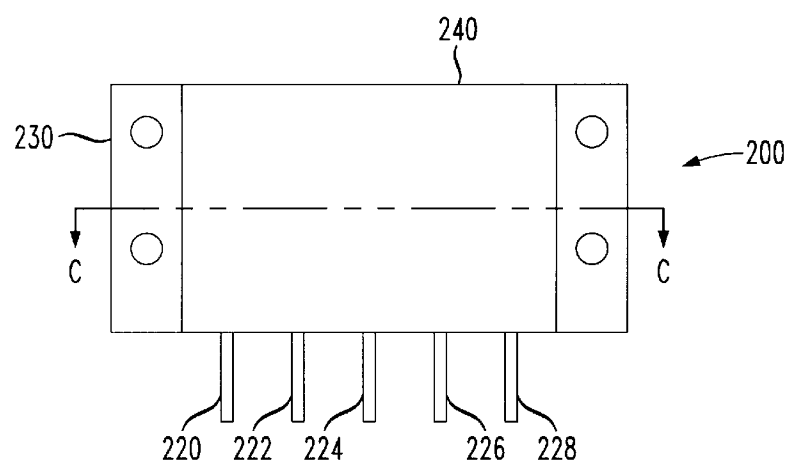
Figure 2C:
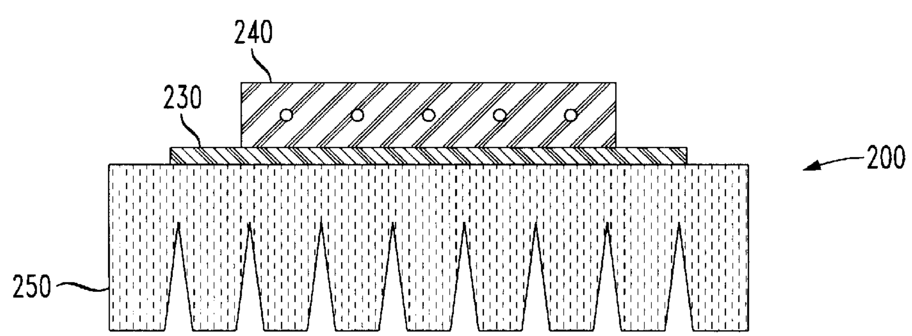

Turning now to FIGS. 2A–2C, illustrated are views of an embodiment of a boost converter module 200 constructed according to the principles of the present invention. More particularly, FIG. 2A illustrates a plan view of the boost converter module 200 prior to encapsulation. The boost converter module 200 includes a power switch 210, a first snubber diode 212, a second snubber diode 214, a snubber capacitor 216 and a boost diode 218 attached to a substrate 230. The boost converter module further includes a power input 220, a control input 222, a ground reference input 224, a power output 226 and an optional input 228.

FIG. 2B illustrates a plan view of the boost converter module 200 following encapsulation (e.g. a thermosetting epoxy molding compound). The components attached to the substrate 230 are now substantially surrounded by an encapsulant 240, leaving the inputs and output exposed.

FIG. 2C illustrates a cross-sectional view of the boost converter module 200 along section lines C—C. After encapsulation, a heat sink 250 is attached to the substrate 230 to complete the boost converter module 200.

The proposed boost converter module 200 can be built on a ceramic substrate. The pads for the parts and majority of connection traces are located on the substrate 230, which can be done with thick film technology. These pads and traces are made of either silver or copper based material with either a printing, deposit or etching process. After the printed ceramic substrate 230 goes through firing, the semiconductor devices, which are in bare die form, and the capacitors are put on the substrate going through reflow solder. The connections for the components of the boost converter module 200 may be made using wire bonding. At this point, the boost converter module 200 is electrically usable and can be tested to guarantee the performance and quality. It is preferable that the boost converter module 200 be encapsulated in an integrated package for handling and reliability purposes. Such packaging may take various forms, such as plastic molding or potting. Since all the work is performed on the top side of the substrate, the bottom side should be clean and flat.

A properly sized heat sink 250 is attached to the bottom of the boost converter module 200 to remove heat generated by the normal operation of the circuit. The integration of the major power devices and part of the snubber circuit significantly reduces the size of the circuit. Since boost converter module 200 may be mounted to the main printed circuit board vertically, the circuit designer has more freedom to place parts compared with using the discrete parts. It is easier to minimize the loops and reduce the associated parasitic inductance and its adverse effects, such as high spikes and ringing. Additionally, the voltage stress on the semiconductor devices and electromagnetic interference (EMI) caused by ringing can be reduced.

Furthermore, another advantage to integrating the boost converter module 200 into an integrated package is improved thermal management. Since a ceramic substrate 230 is a very good insulator as well as a good thermal conductor, the heat sink may be directly attached thereto without worrying about the electrical insulation. Typical thermal resistance between a heat sink 230 with a silkpad as the insulator and a packaged power device is about 1.1° C./W, whereas the comparable thermal resistance present using a direct attachment heat sink 230 is about 0.13° C./W, almost a one order of magnitude reduction. Thus, the circuit using the same devices and heat sink in the module of the present invention can handle substantially more power. Conversely, the module of the present invention can handle the same power as the boost converter with discrete components with a substantial reduction in the size of the heat sink with comparable thermal performance.

For a boost converter with discrete components, the power devices are usually attached to the heat sinks manually. This process requires a greater assembly time and increases the likelihood for mistakes, especially among those different parts in the same packages. The integrated boost converter module 200 effectively converts the manual work to an automated process since printing, die attach, wire bonding, and potting can all be performed by machines. Automation virtually eliminates the chance of placing wrong components on heat sinks, hence the yield and reliability improved. Reduction of the assembly time, and high yield directly translates to lower manufacturing cost.

Additionally, heat sinks used in discrete models are often is custom designed and manufactured. Another advantage of the present invention is the opportunity to use small, less expensive standard heat sinks, like those used with microprocessors. These heat sinks offer the freedom of clip-on or bolt-on attachment. The clip-on heat sinks are more suitable for ceramic parts since the clamping force can be strictly controlled to avoid stress cracking. Since this approach allows the boost module to be reduced in size, this type of heat sink can be employed, resulting in a less expensive assembly.

For a better understanding of conventional techniques for the manufacturing of package integrated devices, see *Hybrid Assemblies and Multichip Modules*, by F. W. Kear, Marcel Dekker, N.Y. (1996), which is incorporated herein by reference.

Although the present invention has been described in detail, those skilled in the art should understand that they can make various changes, substitutions and alterations herein without departing from the spirit and scope of the invention in its broadest form.

What is claimed is:

1. A boost converter module, comprising:

a power switch;

first and second snubber diodes series-coupled between said power switch and a converter output;

a snubber capacitor and a boost diode series-coupled across said second snubber diode; and an encapsulant substantially surrounding said power switch, said first and second snubber diodes, said snubber capacitor and said boost diode to join said power switch, said first and second snubber diodes, said snubber capacitor and said boost diode into an integrated package, said integrated package having:

a control input coupled to said power switch, a power input coupled to said power switch, a snubber inductor input, coupled to a node between said snubber capacitor and said boost diode, and a power output coupled to said converter output.

2. The boost converter module as recited in claim 1 further comprising a single monolithic substrate that supports said power switch, said first and second snubber diodes, said snubber capacitor and said boost diode.

3. The boost converter module as recited in claim 1 further comprising a heat sink in thermal contact with at least one of said power switch, said first and second snubber diodes, said snubber capacitor and said boost diode.

4. The boost converter module as recited in claim 1 wherein said integrated package further has a ground reference input coupled to said power switch.

5. The boost converter module as recited in claim 1 wherein said integrated package further has an input coupled to a node between said first and second snubber diodes.

6. The boost converter module as recited in claim 1 wherein said encapsulant is a thermosetting epoxy molding compound.

7. The boost converter module as recited in claim 1 wherein said power switch is selected from the group consisting of:

a metal oxide semiconductor field-effect transistor (MOSFET), an insulated-gate bipolar transistor (IGBT), a MOS-controlled thyristor, and a bipolar junction transistor (BJT).

8. A method of manufacturing a boost converter module, comprising the steps of:

series-coupling first and second snubber diodes between a power switch and a converter output;

series-coupling a snubber capacitor and a boost diode across said second snubber diode; and substantially surrounding said power switch, said first and second snubber diodes, said snubber capacitor and said boost diode with an encapsulant to join said power switch, said first and second snubber diodes, said snubber capacitor and said boost diode into an integrated package, said integrated package having:

a control input coupled to said power switch, a power input coupled to said power switch, a snubber inductor input, coupled to a node between said snubber capacitor and said boost diode, and a power output coupled to said converter output.

9. The method as recited in claim 8 further comprising the step of supporting said power switch, said first and second snubber diodes, said snubber capacitor and said boost diode with a single monolithic substrate.

10. The method as recited in claim 8 further comprising the step of placing a heat sink in thermal contact with at least one of said power switch, said first and second snubber diodes, said snubber capacitor and said boost diode.

11. The method as recited in claim 8 wherein said integrated package further has a ground reference input coupled to said power switch.

12. The method as recited in claim 8 wherein said integrated package further has an input coupled to a node between said first and second snubber diodes.

13. The method as recited in claim 8 wherein said encapsulant is a thermosetting epoxy molding compound.

14. The method as recited in claim 8 wherein said power switch is selected from the group consisting of:

a metal oxide semiconductor field-effect transistor (MOSFET), an insulated-gate bipolar transistor (IGBT), a MOS-controlled thyristor, and a bipolar junction transistor (BJT).

15. A power converter, comprising:

a boost converter module, including:

a power switch, first and second snubber diodes series-coupled between said power switch and a converter output, a snubber capacitor and a boost diode series-coupled across said second snubber diode, and an encapsulant substantially surrounding said power switch, said first and second snubber diodes, said snubber capacitor and said boost diode to join said power switch, said first and second snubber diodes, said snubber capacitor and said boost diode into an integrated package, said integrated package having:

a control input coupled to said power switch, a power input coupled to said power switch, a snubber inductor input, coupled to a node between said snubber capacitor and said boost diode, and a power output coupled to said converter output;

a boost inductor coupled between a source of DC power and said power input;

a snubber inductor coupled across said power input and said snubber inductor input; and control circuitry, coupled to said control input, that applies control signals to said power switch.

16. The power converter as recited in claim 15 wherein said boost converter module further comprises a single monolithic substrate that supports said power switch, said first and second snubber diodes, said snubber capacitor and said boost diode.

17. The power converter as recited in claim 15 wherein said boost converter module further comprises a heat sink in thermal contact with at least one of said power switch, said first and second snubber diodes, said snubber capacitor and said boost diode.

18. The power converter as recited in claim 15 wherein said integrated package further has a ground reference input coupled between said power switch and said source of DC power.

19. The power converter as recited in claim 15 wherein said integrated package further has an input coupled to a node between said first and second snubber diodes.

20. The power converter as recited in claim 15 wherein said encapsulant is a thermosetting epoxy molding compound.

21. The power converter as recited in claim 15 wherein said power switch is selected from the group consisting of:

a metal oxide semiconductor field-effect transistor (MOSFET), an insulated-gate bipolar transistor (IGBT), a MOS-controlled thyristor, and a bipolar junction transistor (BJT).

* * * * *